United States Patent
Freund et al.

(10) Patent No.: US 6,259,264 B1
(45) Date of Patent: Jul. 10, 2001

(54) APPARATUS AND METHOD FOR TESTING SEMICONDUCTOR LASER CHIPS

(75) Inventors: Joseph Michael Freund, Fogelsville; William Andrew Gault, Mohnton; John Michael Geary, Macungie, all of PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/385,378

(22) Filed: Aug. 30, 1999

(51) Int. Cl.$^7$ .................................................. G01R 31/02
(52) U.S. Cl. ................................. 324/760; 324/755
(58) Field of Search ................................. 324/750, 751, 324/752, 753, 754, 755, 756, 757, 758, 759, 760, 761, 762, 763, 764, 765, 766, 767, 768, 769

(56) References Cited

U.S. PATENT DOCUMENTS

| | | | |
|---|---|---|---|
| 5,325,052 | * 6/1994 | Yamashita | 324/158 P |
| 6,020,750 | * 2/2000 | Berger et al. | 324/755 |
| 6,137,305 | * 10/2000 | Freund et al. | 324/767 |

* cited by examiner

*Primary Examiner*—Safet Metjahic
*Assistant Examiner*—Etienne LeRoux
(74) *Attorney, Agent, or Firm*—Dickstein Shapiro Morin & Oshinsky LLP (57) ABSTRACT

An apparatus and method for performing tests on laser chips that are not labor intensive and will not result in wasted parts should the laser chip fail the test is disclosed. A "bare" laser chip is subjected to a test in accordance with one embodiment by placing the laser chip on an insulating material with an embedded conducting contact through which the current to power the laser chip is passed. A cover plate provides a channel around the laser chip through which a jet of high pressure inert gas is passed to dissipate the self-heating of the laser chip that occurs during the test process. The laser chip is kept in place by physical pressure. In accordance with another embodiment, the temperature of the laser chip is measured and a thermoelectric cooler is used to cool the laser chip. The test on the "bare" laser chip eliminates the need to solder bond the laser chip to a carrier and attach wire bonds to the laser chip, thus reducing associated labor and parts costs.

98 Claims, 4 Drawing Sheets

APPARATUS AND METHOD FOR TESTING SEMICONDUCTOR LASER CHIPS

BACKGROUND OF THE INVENTION

1. Field of the Invention

The present invention relates generally to semiconductor laser chips, and more particularly to a method and apparatus for testing bare laser chips that do not require a submount, carrier or wire bonding of the laser chips.

2. Description of the Related Art

A large number of applications utilize solid state lasers and amplifiers to generate or amplify light at specific wavelengths. Increasingly, laser diodes are employed for communications and are integral to optical disc recording and storage systems.

During production and fabrication of semiconductor laser chips, reliability tests are typically performed by the manufacturer on the semiconductor laser chips to screen out potential reliability hazards. Such testing typically requires the temperature of the laser chip be maintained at a predetermined temperature during the test. For example, present reliability testing of semiconductor lasers includes a test known as a purge of the laser chips. A laser chip has a threshold current $I_{th}$ at which it will lase, i.e., emit coherent light. To maintain reliability over the life of the laser chip, it is desirable for the threshold current $I_{th}$ to remain stable. A laser chip may have an initial threshold current of approximately 10 mA, for example. After the laser chip has been subjected to a purge, the threshold current $I_{th}$ at which a laser chip will lase may change. A change in the threshold current $I_{th}$ after the purge has been completed has been statistically shown to have a direct correlation to the long-term age rate, and hence reliability, of a laser chip. If the threshold current changes by more than some predetermined amount after the purge, the expected life span of a laser chip can be statistically determined, and those laser chips which do not have a determined expected life span within a predetermined range will be discarded as unreliable. Thus, an upper limit for the change in threshold current $I_{th}$ after a purge is determined at which a laser chip will be considered unreliable.

A purge is typically performed by passing 150 mA through the laser chip, while maintaining the temperature of the laser chip at 85° C., for a period of 12 or 24 hours. After the purge is performed, the threshold current $I_{th}$ of the laser chip is measured and compared to the threshold current $I_{th}$ for the laser chip before the purge. If the threshold current $I_{th}$ has changed by more than the upper limit, the laser chip will be considered unreliable and be discarded. For example, the upper limit for a change in the threshold current $I_{th}$ may be 3 mA. Thus, if the laser chip with an initial threshold current of 10 mA has for example a threshold current of 13 mA or more after the purge, it will be considered unreliable and discarded.

Figures 1, 2:
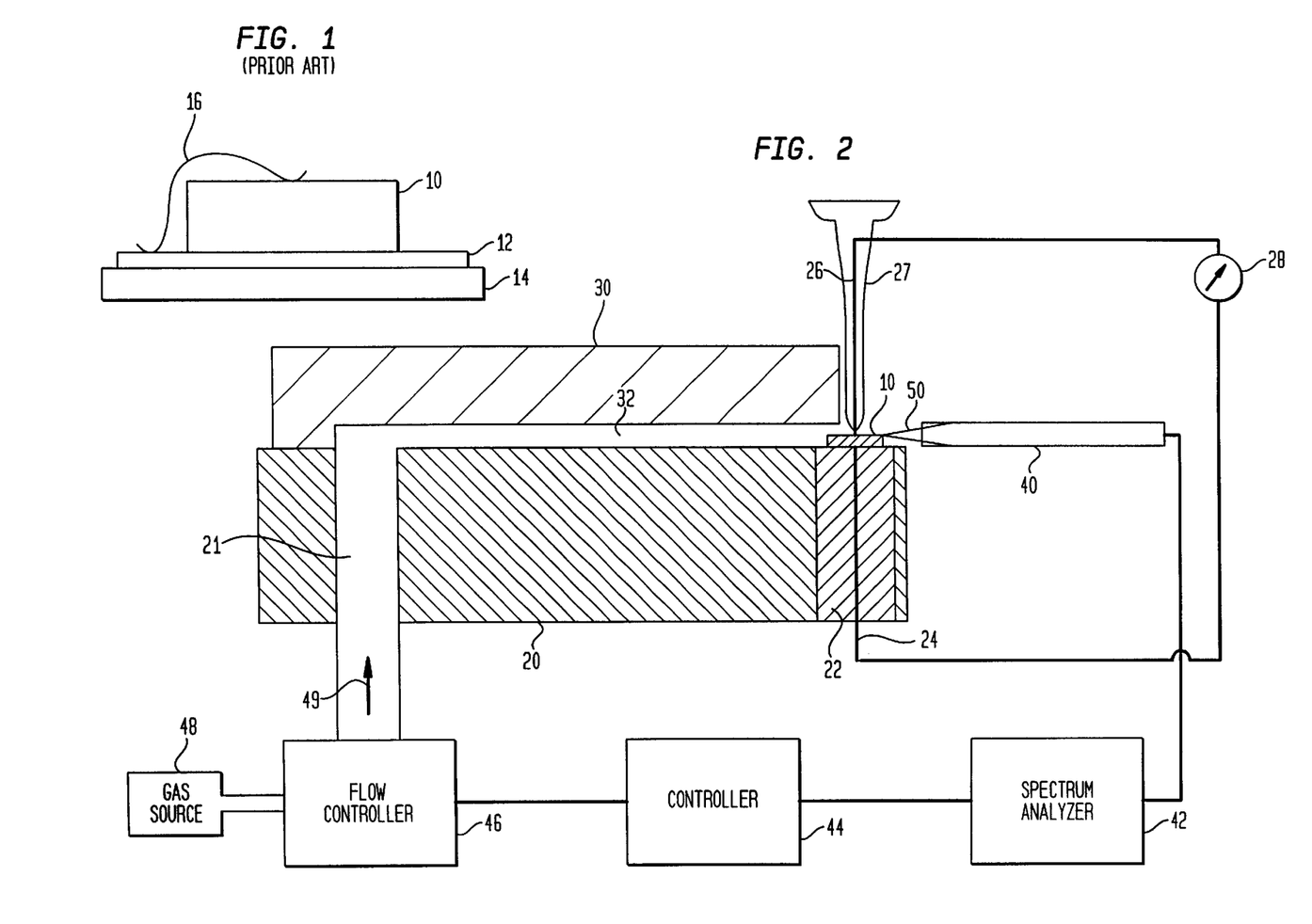
FIG. 1 illustrates a prior art mounting of a laser chip for performing a purge on the laser chip.
FIG. 2 illustrates an assembly for performing a purge on a laser chip having electrical contacts on the top and bottom of the laser chip in accordance with a first embodiment of the present invention.

FIG. 1 illustrates in block diagram form a typical mounting assembly necessary for performing a purge on a laser chip 10. Laser chip 10 is solder bonded to a submount 12, such as for example a silicon substrate. Submount 12 is soldered to a carrier 14, such as a copper carrier, which facilitates good heat sinking of the laser chip 10. Wire bonds 16 must be attached from the laser chip 10 to the submount 12. The laser chip 10 is then subjected to a purge as described above.

There are problems, however, with the conventional mounting of a laser chip 10 to perform tests such as a purge. Every laser chip that is tested must be mounted as described with respect to FIG. 1 above, i.e., soldered to a submount 12 (which is in turn soldered to a carrier 14), and attached by wire bonds 16. If the laser chip 10 passes the purge, the laser chip 10/submount 12 assembly must be de-mounted from the carrier 14 and re-mounted to a final package. If the laser chip 10 does not pass the purge, the laser chip 10/submount 12 assembly must still be de-mounted from the carrier 14 (and discarded) so that the carrier 14 can be reused. In either case the process of de-mounting is labor intensive, thus adding to manufacturing costs. Additionally, if the laser chip 10 fails the purge, the submount 12 is discarded with the laser chip 10, thus increasing manufacturing costs for wasted parts.

The purge assembly process as described above has been streamlined by eliminating the need for the carrier 14 by providing heat sinking from the test device, or alternatively pulsing the purge current to the laser chip, thus allowing the purge to be performed with the laser chip 10 mounted on just the submount 12. While this eliminates one process and handling step (mounting the chip/submount to the carrier), it does not address the issue of the labor required for the wire bonding and the wasted surmounts for laser chips that do not pass the purge.

Thus, there exists a need for an apparatus and method for performing tests on laser chips that are not labor intensive and will not result in wasted parts should the laser chip fail the test.

SUMMARY OF THE INVENTION

The present invention overcomes the problems associated with the prior art and provides an apparatus and method for performing tests on laser chips that are not labor intensive and will not result in wasted parts should the laser chip fail the test.

In accordance with one embodiment of the present invention, a "bare" laser chip is subjected to a test by placing the laser chip on an insulating material with an embedded conducting contact through which the current to power the laser chip is passed. The temperature of the laser chip is determined by measuring its operating wavelength. A cover plate provides a channel around the laser chip through which a jet of high pressure inert gas is passed to dissipate the self-heating of the laser chip that occurs during the test process. The laser chip is kept in place as the gas passes over it by physical pressure.

In accordance with another embodiment, the temperature of the laser chip is determined by measuring its operating wavelength and a thermo-electric cooler (TEC) is used to cool the laser chip to dissipate the self-heating that occurs during the test process.

In accordance with another embodiment, the temperature of the laser chip is measured by a thermistor and a thermo-electric cooler is used to cool the laser chip to dissipate the self-heating that occurs during the test process.

The test on the "bare" laser chip eliminates the need to solder bond the laser chip to a carrier and attach wire bonds to the laser chip, thus reducing associated labor and parts costs. These and other advantages and features of the invention will become apparent from the following detailed description of the invention which is provided in connection with the accompanying drawings, in which like items are referred to by like numerals.

DETAILED DESCRIPTION OF THE PREFERRED EMBODIMENTS

The present invention will be described as set forth in the preferred embodiments illustrated in FIGS. 2–7. Other embodiments may be utilized and structural or logical changes may be made and equivalents substituted without departing from the spirit or scope of the present invention.

In accordance with the present invention, a test can be performed on a bare laser chips that is not labor intensive and will not result in wasted parts should the laser chip fail the test.

FIG. 2 illustrates an assembly for performing a test, such as a purge, on a laser chip 10 in accordance with a first embodiment of the present invention. Specifically, FIG. 2 illustrates an assembly for performing a purge on a laser chip 10 that has electrical contacts on the top and bottom of the chip. A laser chip 10 is placed on an insulating material 22 embedded in a mounting block 20. Insulating material 22 can be any type of dielectric material that will not conduct electricity, such as for example a polymer, an epoxy, or the like, that provides a fairly hard and smooth surface. Mounting block 20 is formed of any type of machinable material, such as for example brass, or other soft material into which the desired features, such as the opening for insulating material 22 and a channel 21 can be machined.

Within insulating material 22 is a conducting contact 24 which extends through the length of insulating material 22 and is connected to current source 28. Conducting contact 24 provides the electrical contact via pressure for the bottom side of laser chip 10 through which the purge current is passed. Laser chip 10 is maintained in position on insulating material 22 by physical pressure exerted on it by a device, such as probe 27. It should be noted that physical pressure can be exerted on laser chip 10 in any manner as is known in the art. A conductive contact 26 in probe 27 provides the electrical contact via pressure for the top side of laser chip 10 and completes the circuit to current source 28. Conducting contacts 24, 26 can be formed of any conductive material such as for example gold or copper. Current source 28 provides the purge current, such as for example 150 mA, to laser chip 10.

A cover plate 30 is placed on mounting block 20 to form a channel 32 connected to channel 21 in mounting block 20. Channels 21 and 32 provide a continuous channel from a flow controller 46 through mounting block 20 to the laser chip 10. A gas source 48 is connected to flow controller 48.

The operation of the assembly of FIG. 2 is as follows. As previously indicated, a purge is typically performed at a bias current of 150 mA while maintaining the temperature of the laser chip at 85° C. for a period of 12 or 24 hours. Prior to purging, laser chip 10 is tested for a number of performance characteristics. One measurement is the wavelength of the laser light at 85° C. As is known in the art, the wavelength output by a laser chip is directly related to its operating temperature. Thus, the wavelength of the laser being output by laser chip 10 can be used to indicate the temperature of the laser chip 10. When current source 28 outputs the purge current, such as for example 150 mA, to laser chip 10 through contacts 24, 26, laser chip 10 outputs a beam of light 50. Light beam 50 is aligned with an optical fiber 40 which is coupled to a spectrum analyzer 42. Spectrum analyzer 42 measures the wavelength of beam 50, and thereby determines the temperature of laser chip 10.

When laser chip 10 is biased to the 150 mA purge bias condition, laser chip 10 will self-heat causing the wavelength to shift, thus indicating a change in temperature. The temperature of laser chip as determined by spectrum analyzer 42 is input to controller 44. Controller 44 may include a programmable logic device, one example being a microprocessor. If a microprocessor is used, it may be any conventional general purpose single- or multi-chip microprocessor, or may be any conventional special purpose microprocessor such as a digital signal processor. When the temperature of the laser chip 10 rises above 85° C., controller 44 will turn on flow controller 46. Flow controller 46 will cause a high pressure jet of gas from gas source 48 to flow through channels 21, 32 in the direction of arrow 49. The jet of gas will flow over laser chip 10, thereby providing cooling of the laser chip 10 to maintain the temperature of laser chip 10 at 85° C. The gas from gas source 48 is preferably a pre-filtered gas that does not contain a lot of particulate matter that could accumulate on laser chip 10, such as for example filtered air, nitrogen ($N_2$), argon (Ar) or any other inert gas. By continuously monitoring the beam of light 50 via spectrum analyzer 42 in a feed back loop through controller 44, the flow of gas from flow controller 46 can be set to maintain a wavelength corresponding to a laser chip 10 temperature of 85° C.

Thus, in accordance with the present invention, a purge test can be performed on a laser chip 10 without having to solder bond laser chip 10 to a submount or a carrier, thus reducing the processing and handling steps. Furthermore, if laser chip 10 fails the purge, it can be discarded without having first having to remove it from a carrier and without a submount attached, thus further reducing handling steps and reducing the amount of wasted parts, i.e., the submount.

Figure 3:
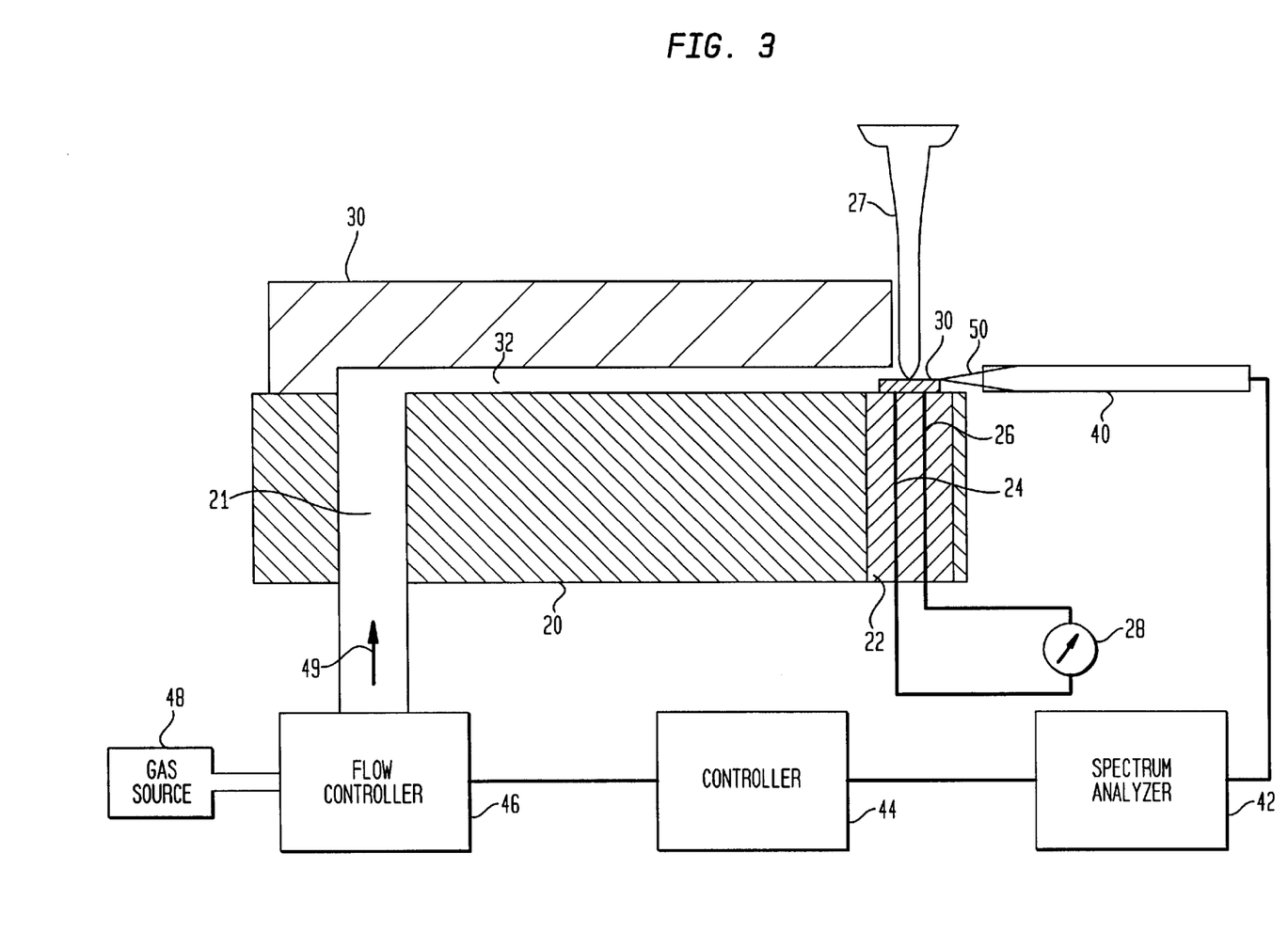
FIG. 3 illustrates an assembly for performing a purge on a laser chip having coplanar contacts in accordance with the first embodiment of the present invention.

FIG. 3 illustrates an assembly for performing a purge on a laser chip 30 in accordance with a modified first embodiment of the present invention. Specifically, FIG. 3 illustrates an assembly for performing a purge on a laser chip 30 that has coplanar electrical contacts, i.e., contacts on the same side of the chip. The operation of the assembly of FIG. 3 is identical to that as described with respect to FIG. 2 except conducting contacts 24, 26 are both within insulating material 22 to provide the electrical contacts via pressure for the contacts on the bottom side of laser chip 30 through which the purge current is passed. A device, such as probe 27 without any electrical conductors, is provided on top of laser chip 30 to provide physical pressure to laser chip 30 to maintain it in position on insulating material 22.

Figure 4:
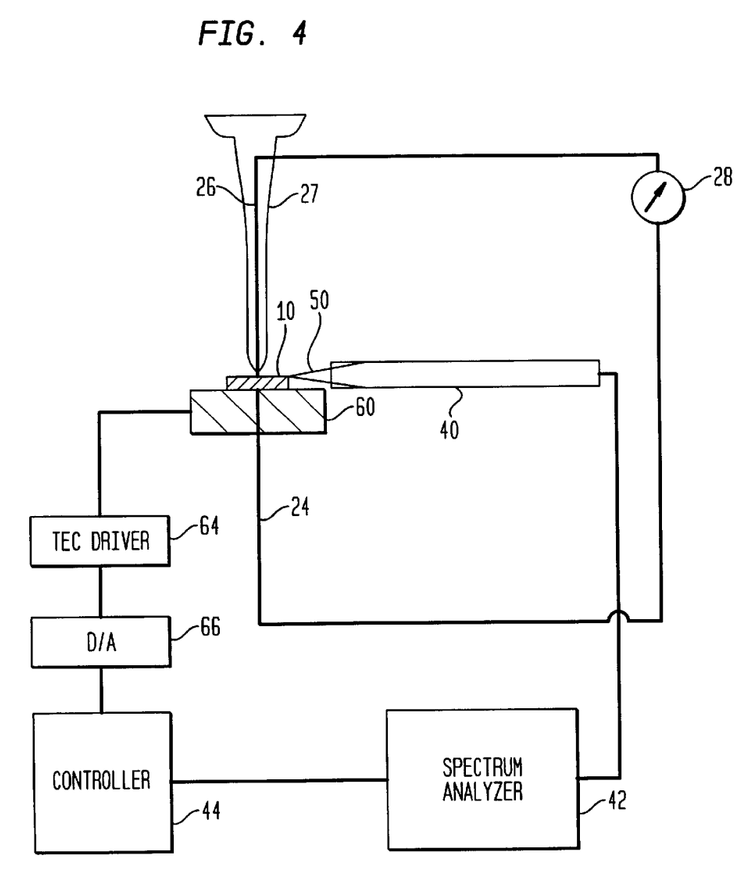
FIG. 4 illustrates an assembly for performing a purge on a laser chip having electrical contacts on the top and bottom of the laser chip in accordance with a second embodiment of the present invention.

FIG. 4 illustrates an assembly for performing a test, such as a purge, on a laser chip 10 in accordance with a second embodiment of the present invention. Specifically, FIG. 4 illustrates an assembly for performing a purge on a laser chip 10 that has electrical contacts on the top and bottom of the chip. A laser chip 10 is placed on a temperature device, such as a thermo-electric cooler (TEC) 60. The temperature of TEC 60 is varied based on an input signal to TEC Driver 64 from controller 44 through a digital to analog (D/A) converter 66.

A conducting contact 24 extends through TEC 60 and is connected to current source 28. Conducting contact 24 provides the electrical contact via pressure for the bottom side of laser chip 10 through which the purge current is passed. Laser chip 10 is maintained in position on insulating material 22 by physical pressure exerted on it by a device, such as probe 27. It should be noted that physical pressure can be exerted on laser chip 10 in any manner as is known in the art. A conductive contact 26 in probe 27 provides the electrical contact via pressure for the top side of laser chip 10 and completes the circuit to current source 28. Conducting contacts 24, 26 can be formed of any conductive material such as for example gold or copper. Current source 28 provides the purge current, such as for example 150 mA, to laser chip 10.

The operation of the assembly of FIG. 4 is similar to that as described with respect to FIG. 2, except that when the temperature of the laser chip 10 rises-above 85° C., controller 44 will send a signal to TEC Driver 64 to adjust the temperature of TEC 60 to cool laser chip 10. By continuously monitoring the output wavelength to determine the temperature of laser chip 10 and adjust the temperature of TEC 60 accordingly, the temperature of the laser chip 10 can be maintained at a desired level, such as for example 85° C.

Figure 5:
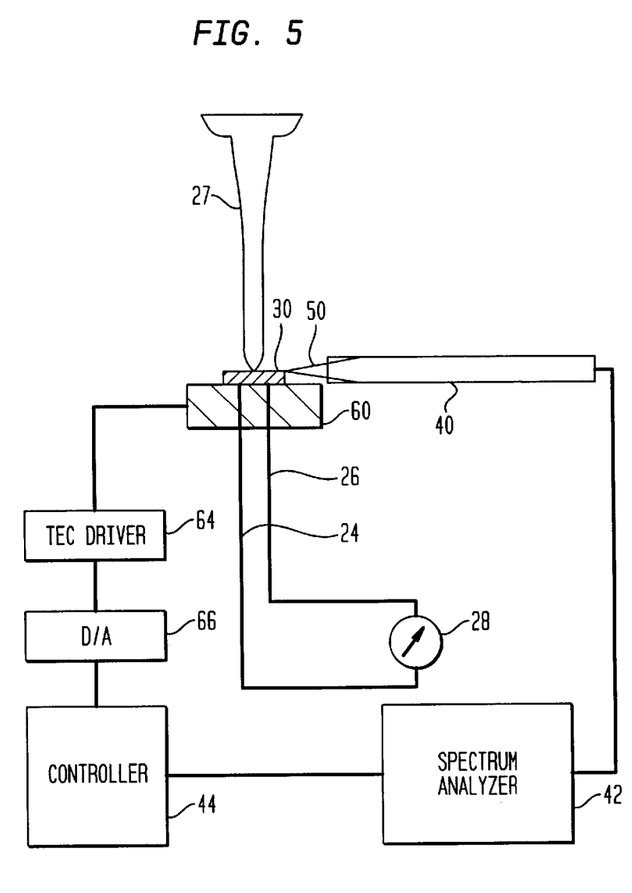
FIG. 5 illustrates an assembly for performing a purge on a laser chip having coplanar contacts in accordance with the second embodiment of the present invention.

FIG. 5 illustrates an assembly for performing a purge on a laser chip 30 in accordance with a modified second embodiment of the present invention. Specifically, FIG. 5 illustrates an assembly for performing a purge on a laser chip 30 that has coplanar electrical contacts. The operation of the assembly of FIG. 5 is identical to that as described with respect to FIG. 4 except conducting contacts 24, 26 are both within TEC 60 to provide the electrical contacts via pressure for the contacts on the bottom side of laser chip 30 through which the purge current is passed. A device, such as probe 27 without any electrical conductors, is provided on top of laser chip 30 to provide physical pressure to laser chip 30 to maintain it in position on TEC 60.

Figure 6:
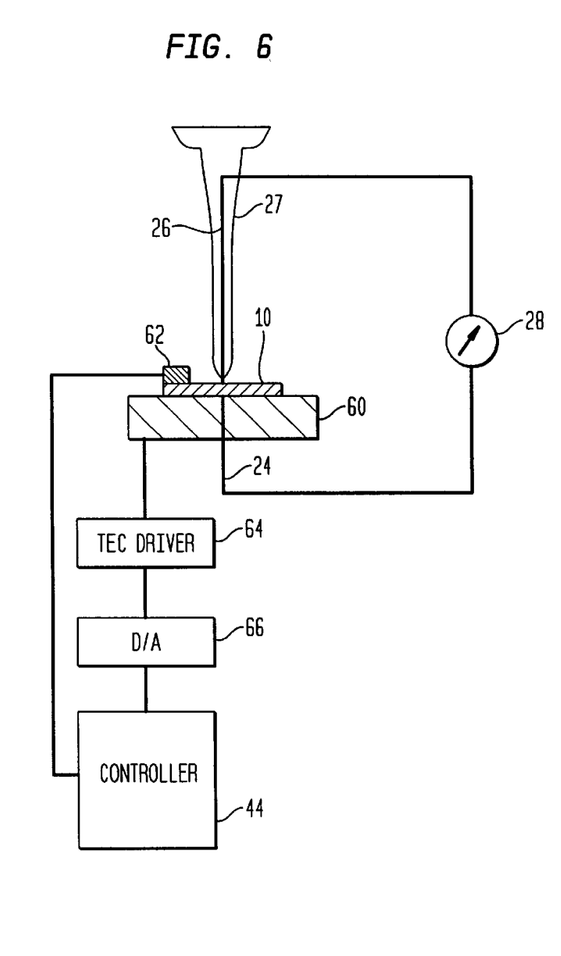
FIG. 6 illustrates an assembly for performing a purge on a laser chip having electrical contacts on the top and bottom of the laser chip in accordance with a third embodiment of the present invention.

FIG. 6 illustrates an assembly for performing a test, such as a purge, on a laser chip 10 in accordance with a third embodiment of the present invention. Specifically, FIG. 6 illustrates an assembly for performing a purge on a laser chip 10 that has electrical contacts on the top and bottom of the chip. The assembly of FIG. 6 is similar to that as described with respect to FIG. 4 except that a thermistor 62 is provided to directly measure the temperature of laser chip 10. The temperature as measured by thermistor 62 is input to controller 44.

The operation of the assembly of FIG. 6 is similar to that as described with respect to FIG. 2, except that when the temperature of the laser chip 10 as measured by thermistor 62 rises above 85° C., controller 44 will send a signal to TEC Driver 64 to adjust the temperature of TEC 60 to cool laser chip 10. By continuously monitoring the temperature of laser chip 10 and adjusting the temperature of TEC 60 accordingly, the temperature of the laser chip 10 can be maintained at a desired level, such as for example 85° C.

Figure 7:
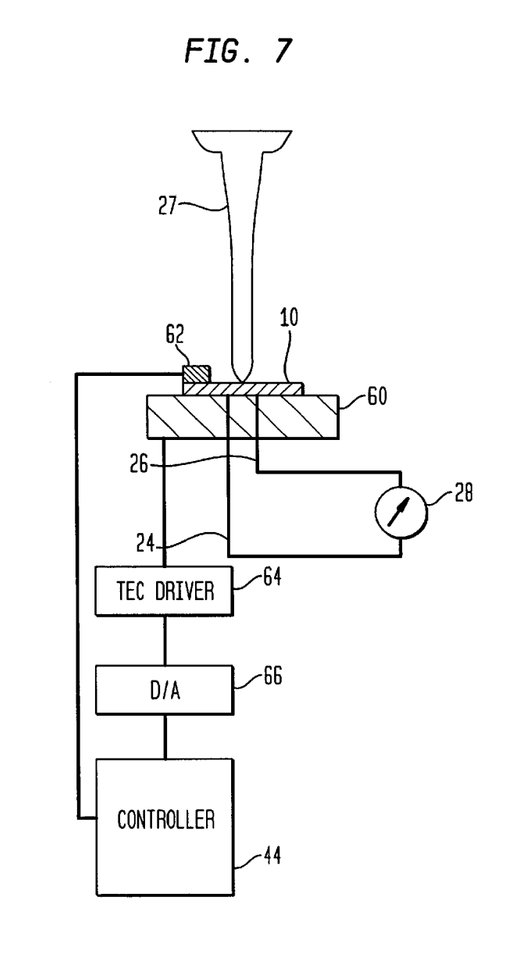
FIG. 7 illustrates an assembly for performing a purge on a laser chip having coplanar contacts in accordance with the third embodiment of the present invention.

FIG. 7 illustrates an assembly for performing a purge on a laser chip 30 in accordance with a modified third embodiment of the present invention. Specifically, FIG. 7 illustrates an assembly for performing a purge on a laser chip 30 that has coplanar electrical contacts. The operation of the assembly of FIG. 7 is identical to that as described with respect to FIG. 6 except conducting contacts 24, 26 are both within TEC 60 to provide the electrical contacts via pressure for the contacts on the bottom side of laser chip 30 through which the purge current is passed. A device, such as probe 27 without any electrical conductors, is provided on top of laser chip 30 to provide physical pressure to laser chip 30 to maintain it in position on TEC 60.

Thus, in accordance with the present invention, tests that require the temperature of a laser chip to be maintained at a predetermined level can be performed without intensive labor for set up and will not result in wasted parts should the laser chip fail the test. It should be noted that while the invention has been described with respect to performing a purge test on a bare laser chip, the invention is not so limited and may be used to perform any type of test on a laser chip.

Reference has been made to preferred embodiments in describing the invention. However, additions, deletions, substitutions, or other modifications which would fall within the scope of the invention defined in the claims may be implemented by those skilled in the art and familiar with the disclosure of the invention without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A device for holding a semiconductor laser chip during a test, said device comprising:
   a mounting block;
   an insulating material mounted to said mounting block, said insulating material having a top surface for placement of a semiconductor laser chip;
   at least one electrical conductor passing through said insulating material to said top surface to provide a contact for supplying current to a semiconductor laser chip;
   at device for applying pressure to a top surface of a semiconductor laser chip to maintain it in place on said top surface of said insulating material; and
   a cover placed over at least a portion of said mounting block to form a channel through which a gas can flow, said channel having an output which directs a gas toward said top surface of said insulating material.

2. The device according to claim 1, further comprising:
   a semiconductor laser chip placed on said top surface of said insulating material.

3. The device according to claim 1, wherein said insulating material is embedded in said mounting block.

4. The device according to claim 1, wherein said device for applying pressure includes an electrical conductor to provide a second contact for supplying said current to a semiconductor laser chip.

5. The device according to claim 1, further comprising a second electrical conductor passing through said insulating material to said top surface to provide a second contact for supplying said current to a semiconductor laser chip.

6. The device according to claim 1, wherein said insulating material is a polymer.

7. The device according to claim 6, wherein said polymer is epoxy.

8. The device according to claim 1, wherein said mounting block is formed of a machinable material.

9. The device according to claim 8, wherein said machinable material is brass.

10. The device according to claim 1, wherein said test is a purge test.

11. A device for performing a test on a semiconductor laser chip, said device comprising:
   an insulating support surface to support a semiconductor laser chip;
   at least one conductive contact on a top surface of said insulating support surface to supply current to a semiconductor laser chip; and
   a channel through which a cooling gas can flow over at least a portion of said insulating support surface.

12. The device according to claim 11, further comprising:
   a mounting block in which said insulating support surface is embedded.

13. The device according to claim 12, wherein said mounting block is formed of a machinable material.

14. The device according to claim 13, wherein said machinable material is brass.

15. The device according to claim 12, further comprising:
   a cover placed over at least a portion of said mounting block and said insulating support surface to form said channel.

16. The device according to claim 11, further comprising:
   a semiconductor laser chip placed on said top surface of said insulating support surface.

17. The device according to claim 11, further comprising:
   a device for applying pressure to a top surface of a semiconductor laser chip to maintain it in place on said top surface of said insulating support surface.

18. The device according to claim 17, wherein said device for applying pressure includes an electrical conductor to provide said current.

19. The device according to claim 11, further comprising a second electrical contact on said top surface of said insulating support surface for supplying said current.

20. The device according to claim 11, wherein said insulating support surface is formed from a polymer.

21. The device according to claim 20, wherein said polymer is epoxy.

22. The device according to claim 11, wherein said test is a purge test.

23. A device for holding a semiconductor laser chip during a test, said device comprising:
   a temperature device having a top surface for placement of a semiconductor laser chip, said temperature device adapted to vary a temperature of said semiconductor laser chip;
   at least one electrical contact on said top surface to supply current to a semiconductor laser chip; and
   a device for applying pressure to a top surface of a semiconductor laser chip to maintain it in place on said top surface of said temperature device.

24. The device according to claim 23, further comprising:
   a semiconductor laser chip placed on top of said temperature device.

25. The device according to claim 23, wherein said device for applying pressure includes an electrical conductor to provide a second contact for supplying said current to a semiconductor laser chip.

26. The device according to claim 23, further comprising a second electrical contact on said top surface for supplying said current to a semiconductor laser chip.

27. The device according to claim 23, wherein said temperature device is a thermo-electric cooler (TEC).

28. The device according to claim 23, wherein said test is a purge test.

29. A system for performing a test on a semiconductor laser chip, said system comprising:
   a holding device to hold a semiconductor laser chip during said test and to provide cooling of said semiconductor laser chip during said test;
   a flow controller to control a flow of a gas, wherein said holding device comprises:
      an insulating material having a top surface for placement of a semiconductor chip;
      at least one electrical conductor passing through said insulating material to said top surface to provide a contact for supplying current to a semiconductor laser chip;
      a device for applying pressure to a top surface of a semiconductor laser chip to maintain it in place on said top surface of said insulating material; and
   a cover placed over at least a portion of said mounting block and said insulating material to form a channel through which said gas can flow;
   said system further comprising:
   a temperature determining device to determine a temperature of a semiconductor laser chip during said test; and
   a controller connected to said temperature determining device to maintain said temperature of a semiconductor laser chip at a predetermined level, wherein said controller controls said flow controller to vary said flow of said gas over a semiconductor laser chip to maintain its temperature at said predetermined level.

30. The system according to claim 29, further comprising:
   a semiconductor laser chip placed on said top surface of said insulating material.

31. The system according to claim 29, further comprising a mounting block, wherein said insulating material is embedded in said mounting block.

32. The system according to claim 31, wherein said mounting block is formed of a machinable material.

33. The system according to claim 32, wherein said machinable material is brass.

34. The system according to claim 29, wherein said device for applying pressure includes an electrical conductor to provide a second contact for supplying said current to a semiconductor laser chip.

35. The system according to claim 29, further comprising a second electrical conductor passing through said insulating material to said top surface to provide a second contact for supplying said current to a semiconductor laser chip.

36. The system according to claim 29, wherein said insulating material is a polymer.

37. The system according to claim 36, wherein said polymer is epoxy.

38. The system according to claim 29, wherein said gas is a filtered gas.

39. The system according to claim 29, wherein said gas is air.

40. The system according to claim 29, wherein said gas is an inert gas.

41. The system according to claim 40, wherein said gas is nitrogen.

42. The system according to claim 40, wherein said gas is argon.

43. The system according to claim 29, wherein said temperature determining device further comprises:

an optical fiber through which an output of a semiconductor laser chip is passed during said test; and a spectrum analyzer connected to said optical fiber to measure a wavelength of said output from a semiconductor laser chip during said test, wherein said temperature is determined based on said measured wavelength of said output.

44. The system according to claim 43, wherein said controller further comprises a processor, said processor causing said flow controller to vary said flow of said gas based on said determined temperature as determined by said measured wavelength of said output to maintain said temperature at said predetermined level.

45. A system for performing a test on a semiconductor laser chip, said system comprising:

a flow controller to control a flow of a gas;

a holding device to hold a semiconductor laser chip during said test and to provide cooling of said semiconductor laser chip during said test, said holding device further comprising:

an insulating support surface to support a semiconductor laser chip;

at least one conductive contact on a top surface of said insulating support surface for supplying current to a semiconductor laser chip; and a channel through which a cooling gas can flow over at least a portion of said insulating support surface, said system further comprising:

a temperature determining device to determine a temperature of a semiconductor laser chip during said test; and a controller connected to said temperature determining device, said controller controlling said flow controller to vary said flow of said cooling gas to maintain said temperature of a semiconductor laser chip at a predetermined level.

46. The system according to claim 45, wherein said holding device further comprises:

a mounting block in which said insulating support surface is embedded.

47. The system according to claim 46, wherein said mounting block is formed of a machinable material.

48. The system according to claim 47, wherein said machinable material is brass.

49. The system according to claim 46, further comprising:

a cover placed over at least a portion of said mounting block and said insulating support surface to form said channel.

50. The system according to claim 45, further comprising:

a semiconductor laser chip placed on said top surface of said insulating support surface.

51. The system according to claim 45, further comprising:

a device for applying pressure to a top surface of a semiconductor laser chip to maintain it in place on said top surface of said insulating support surface.

52. The system according to claim 51, wherein said device for applying pressure includes an electrical conductor to provide said current.

53. The system according to claim 45, farther comprising a second electrical contact on said top surface of said insulating support surface for supplying said current.

54. The system according to claim 45, wherein said insulating support surface is formed from a polymer.

55. The system according to claim 54, wherein said polymer is epoxy.

56. The system according to claim 45, wherein said gas is a filtered gas.

57. The system according to claim 45, wherein said gas is air.

58. The system according to claim 45, wherein said gas is an inert gas.

59. The system according to claim 58, wherein said gas is nitrogen.

60. The system according to claim 58, wherein said gas is argon.

61. The system according to claim 45, wherein said temperature determining device further comprises:

an optical fiber through which an output of a semiconductor laser chip is passed during said test; and a spectrum analyzer connected to said optical fiber to measure a wavelength of said output from a semiconductor laser chip during said test, wherein said temperature is determined based on said measured wavelength of said output.

62. The system according to claim 61, wherein said controller further comprises a processor, said processor causing said flow controller to vary said flow of said cooling gas based on said determined temperature as determined by said measured wavelength of said output to maintain said temperature at said predetermined level.

63. A system for performing a test on a semiconductor laser chip, said system comprising:

a holding device to hold a semiconductor laser chip during said test and to provide cooling of said semiconductor laser chip during said test, said holding device further comprising:

a temperature device having a top surface for placement of a semiconductor laser chip, said temperature device adapted to vary a temperature of said semiconductor laser chip;

at least one electrical contract on said top surface to supply said current; and a device for applying pressure to a top surface of a semiconductor laser chip and maintain it in place on said top surface of said temperature device;

said system further comprising:

a temperature determining device to determine a temperature of a semiconductor laser chip during said test; and a controller connected to said temperature device and responsive to said temperature determining device to maintain said temperature of a semiconductor laser chip at a predetermined level.

64. The system according to claim 63, wherein said device for applying pressure includes an electrical conductor to provide a second contact for supplying said current to a semiconductor laser chip.

65. The system according to claim 63, further comprising a second electrical contact on said top surface for supplying said current to a semiconductor laser chip.

66. The system according to claim 63, wherein said temperature device is a thermo-electric cooler (TEC).

67. The system according to claim 66, further comprising:

a driver which receives a signal from said controller and in response outputs a signal which varies said temperature of said temperature device.

68. The system according to claim 63, wherein said temperature determining device further comprises a thermistor.

69. The system according to claim 63, wherein said temperature determining device further comprises:

an optical fiber through which an output of a semiconductor laser chip is passed during said test; and a spectrum analyzer connected to said optical fiber to measure a wavelength of said output from a semiconductor laser chip during said test, wherein said temperature is determined based on said measured wavelength of said output.

70. The system according to claim 29, wherein said test is a purge test.

71. The system according to claim 70, wherein said predetermined level for said temperature is 85° C.

72. A method of performing a test on a semiconductor laser chip comprising:

placing said semiconductor laser chip in a test position on an insulating material;

applying a current to said semiconductor laser chip;

forming a channel for a gas to flow through, said channel being formed at least partially by a cover placed over at least a portion of said insulating material; and cooling said semiconductor laser chip to maintain it at a predetermined temperature by flowing said gas through said channel.

73. The method according to claim 72, wherein said step of placing further comprises:

applying pressure to a top surface of said semiconductor laser chip to maintain said semiconductor laser chip in place on said insulating material.

74. The method according to claim 73, wherein before said step of placing said semiconductor laser chip on an insulating material, said method comprises:

embedding said insulating material in a mounting block.

75. The method according to claim 74, wherein said step of forming further comprises:

forming said channel at least partially by said mounting block, said insulating material, and said cover placed over at least a portion of said mounting block and said insulating material.

76. The method according to claim 75, wherein said insulating material is a polymer.

77. The method according to claim 76, wherein said polymer is epoxy.

78. The method according to claim 75, wherein said mounting block is formed of a machinable material.

79. The method according to claim 78, wherein said machinable material is brass.

80. The method according to claim 75, wherein said gas is a filtered gas.

81. The method according to claim 75, wherein said gas is air.

82. The method according to claim 75, wherein said gas is an inert gas.

83. The method according to claim 82, wherein said gas is nitrogen.

84. The method according to claim 82, wherein said gas is argon.

85. A method for performing a test on a semiconductor laser chip comprising:

placing said semiconductor laser chip on a temperature device, said temperature device adapted to vary a temperature of said semiconductor laser chip;

applying pressure to a top surface of said semiconductor laser chip to maintain said semiconductor laser chip in place on said temperature device;

applying a current to said semiconductor laser chip; and varying said temperature of said semiconductor laser chip by said temperature device.

86. The method according to claim 85, wherein said temperature device includes a thermo-electric cooler (TEC).

87. The method according to claim 72, further comprising:

determining a temperature of said semiconductor laser chip.

88. The method according to claim 87, wherein said determining step further comprises:

measuring a wavelength of an output from said semiconductor laser chip; and determining said temperature of said semiconductor laser chip based on said measured wavelength.

89. The method according to claim 87, wherein said determining step further comprises:

measuring said temperature of said semiconductor laser chip.

90. The method according to claim 72, wherein said test is a purge test.

91. The method according to claim 90, wherein said predetermined level for said temperature of said semiconductor laser chip is 85° C.

92. The method according to claim 90, wherein said current is 150 mA.

93. The system according to claim 45, further comprising:

a semiconductor laser chip placed on said insulating support surface.

94. The system according to claim 63, further comprising:

a semiconductor laser chip placed on said top surface of said temperature device.

95. The method according to claim 85, further comprising:

determining a temperature of said semiconductor laser chip.

96. The method according to claim 95, wherein said determining step further comprises:

measuring a wavelength of an output from said semiconductor laser chip; and determining said temperature of said semiconductor laser chip based on said measured wavelength.

97. The method according to claim 95, wherein said determining step further comprises:

measuring said temperature of said semiconductor laser chip.

98. The method according to claim 85, wherein said test is a purge test.

* * * * *